(12) United States Patent
Lu et al.

(10) Patent No.: US 7,400,998 B2
(45) Date of Patent: Jul. 15, 2008

(54) TEST APPARATUS AND TEST METHOD

(75) Inventors: Xin Lu, Shenzhen (CN); Shih-Fang Wong, Shenzhen (CN)

(73) Assignees: Hong Fu Jin Precision Industry (Shen Zhen) Co., Ltd., Longhua Town, Bao'an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/563,686

(22) Filed: Nov. 28, 2006

(65) Prior Publication Data

US 2007/0208527 A1     Sep. 6, 2007

(30) Foreign Application Priority Data

Mar. 2, 2006   (CN)   .................... 2006 1 0034116

(51) Int. Cl.
*G06F 19/00* (2006.01)
*G06F 15/00* (2006.01)

(52) U.S. Cl. ........................................ 702/122

(58) Field of Classification Search ................ 702/119, 702/122; 714/729, 741, 724, 736; 324/765, 324/73.1
See application file for complete search history.

(56) References Cited

U.S. PATENT DOCUMENTS

| | | | | |
|---|---|---|---|---|
| 4,229,796 A | * | 10/1980 | Garrett | .......................... 702/39 |
| 6,038,400 A | * | 3/2000 | Bell et al. | ...................... 710/11 |
| 6,499,121 B1 | | 12/2002 | Roy et al. | |
| 6,559,671 B2 | | 5/2003 | Miller et al. | |
| 6,691,270 B2 | | 2/2004 | Blasco Allue et al. | |
| 6,948,096 B2 | * | 9/2005 | Parvathala et al. | ............. 714/30 |
| 7,154,257 B2 | * | 12/2006 | Le et al. | .................. 324/158.1 |
| 7,265,570 B2 | * | 9/2007 | Ong | .......................... 324/765 |
| 2003/0083842 A1 | * | 5/2003 | Miller et al. | ................. 702/122 |
| 2005/0063320 A1 | * | 3/2005 | Klotz et al. | .................. 370/254 |
| 2005/0143941 A1 | * | 6/2005 | Forth et al. | .................... 702/61 |

OTHER PUBLICATIONS

Liau et al., 'Computational Intelligence-based Testing for Noise and Robustness Analysis', Jul. 2005, IEEE Publication, pp. 279-284.*

* cited by examiner

*Primary Examiner*—Edward Raymond
*Assistant Examiner*—Elias Desta
(74) *Attorney, Agent, or Firm*—Winston Hsu

(57) ABSTRACT

A test apparatus adapted for testing different electronic devices is provided. The apparatus provides a standard interface for operating with the different electronic devices. The interface provides an optional interface region, an optional test command region, and a selected test command region. The optional interface region is for displaying optional interfaces. The optional test command region is for displaying optional test commands relating to an interface selected in the optional interface region. The selected test command region is for displaying test commands selected from the optional test command region. In response to a selection on the user interface, the apparatus recognizes the interface and the test commands selected, and transmits instruction sets corresponding to the test commands through the interface recognized to the corresponding electronic device, thereby driving the electronic device performing required tests.

7 Claims, 3 Drawing Sheets

TEST APPARATUS AND TEST METHOD

BACKGROUND

1. Technical Field

The present invention relates to test apparatuses and test methods, and particularly to a test apparatus and test method for providing a standard interface to operate a number of different electronic devices.

2. General Background

Generally speaking, newly manufactured products must be tested to ensure they conform to operating specification requirements before they can be distributed into the market. In order to test such products, such products are connected to particular test apparatuses through corresponding interfaces so as to perform required tests thereon.

Different products may employ different serial interfaces with different protocols for communication, such as the I2C (Inter Integrated Circuit) interface, the RS232 (Recommend Standard 232) interface, the USB (Universal Serial Bus) interface, etc. For example, displays, media players, and mice, adopt the I2C interface, the RS232 interface, and the USB interface respectively for communicating with an external device. Consequently, in order to test different products, it is often necessary to provide a plurality of particular test apparatuses, each of which is provided with necessary test commands for testing a specific product. For different test apparatuses, different program applications are separately required for providing different user interfaces. Therefore, more program applications are required if there are more different products to be tested. The cost of tests increases with increasing program applications and test apparatuses required for testing different products.

What is needed, therefore, is a test apparatus and method that provides a standard user interface for operating with a number of different to-be-tested electronic devices.

SUMMARY

A test apparatus adapted for testing different electronic devices is provided. The apparatus includes a plurality of interfaces, a storage unit, an interface module, and a processing unit. The interfaces are configured for communicating with the electronic devices, wherein each interface employs a different protocol and is assigned with an interface number for identification. The storage unit is for storing an interface number list and a test command list, wherein the interface number list records the interfaces and the associated interface numbers, and the test command list records test commands relating to the interfaces and instruction sets each corresponding to a test command. The interface module is configured for displaying the interfaces and the test commands allowable to be selective through a user interface, and obtaining a selected interface and associated test commands in response to a selection. The processing unit is configured for parsing information of the selected interface and associated test commands from the interface module to obtain the interface number corresponding to the selected interface and the instruction sets corresponding to the selected test commands according to the interface number list and the test command list, and transmitting the instruction sets obtained to the corresponding interface according to the interface number obtained, thereby driving the electronic device connected thereto performing required tests according to the instruction sets.

A test method used in a test apparatus for testing different electronic devices is also provided, wherein the test apparatus includes a plurality of interfaces configured for communicating with the electronic devices. The method includes the steps of: (a) displaying a user interface providing an optional interface region and an optional test command region, wherein the optional interface region is configured for displaying optional interfaces allowable to be selective, and the optional test command region is configured for displaying optional test commands relating to an interface selected in the optional interface region, the test commands allowable to be selective and each corresponding to an instruction set; (b) obtaining information of the interface and the test commands selected from the user interface; (c) parsing the information of the interface and the test commands selected to obtain the instruction sets corresponding to the test commands selected; and (d) transmitting the instruction sets obtained to the corresponding electronic device through the interface selected to drive the electronic device performing required tests.

Other advantages and novel features will be drawn from the following detailed description with reference to the attached drawing, in which:

DETAILED DESCRIPTION OF THE EMBODIMENT

Figure 1:
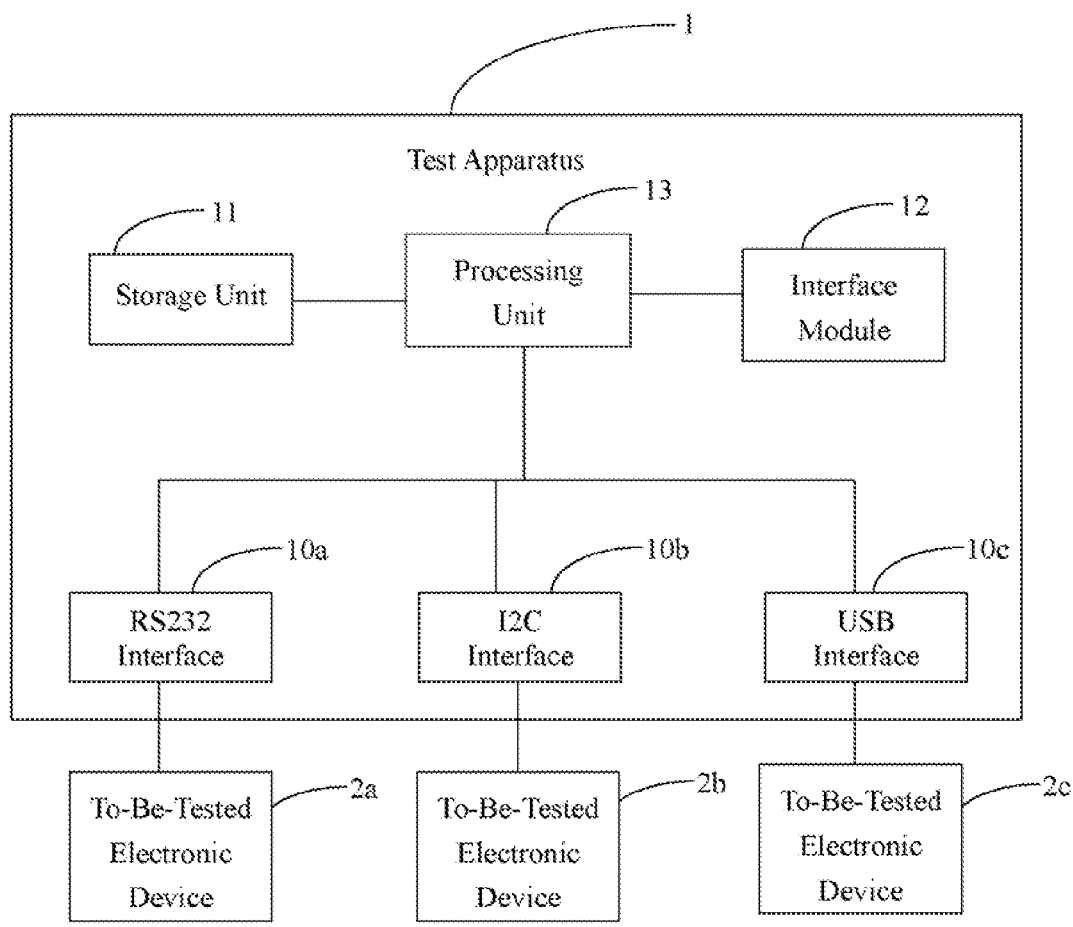
FIG. 1 is a schematic diagram of a hardware infrastructure of a test apparatus adapted for testing different electronic devices connected thereto in accordance with a preferred embodiment of the present invention.

FIG. 1 is a schematic diagram of a hardware infrastructure of a test apparatus adapted for testing different electronic devices in accordance with a preferred embodiment of the present invention. The test apparatus 1 includes a plurality of interfaces, a storage unit 11, an interface module 12, and a processing unit 13. For sake brevity, interfaces 10a, 10b, 10c are depicted hereinafter. Furthermore, each interface employs a different protocol, such as RS232 protocol, I2C protocol, and USB protocol. In other words, the interface 10a is an RS232 interface, the interface 10b is an I2C interface, and the interface 10c is a USB interface. However, in other cases, the number of the interfaces and interface types may be different from this embodiment.

Each interface is configured for connecting to a particular to-be-tested electronic device. For example, the interface 10a is adapted for connecting to a media player 2a, the interface 10b is adapted for connecting to a display 2b, and the interface 10c is adapted for connecting to a mouse 2c. Moreover, each interface is assigned an interface number for identification. For example, the interface 10a is assigned to an interface number '00', the interface 10b is assigned to an interface number '01', and the interface 10c is assigned to an interface number '10'. In addition, each interface is operable to transmit multiple test commands for driving the electronic device connected thereto to perform required tests. Each test command is made up of an instruction set and an interface number. The instruction set define operations and parameters relating to the operations.

The storage unit 11 is for storing an interface number list and a test command list. The interface number list is configured for recording the interfaces and the interface numbers assigned thereto. The test command list is configured for recording each interface number and associated test commands.

Figure 2:
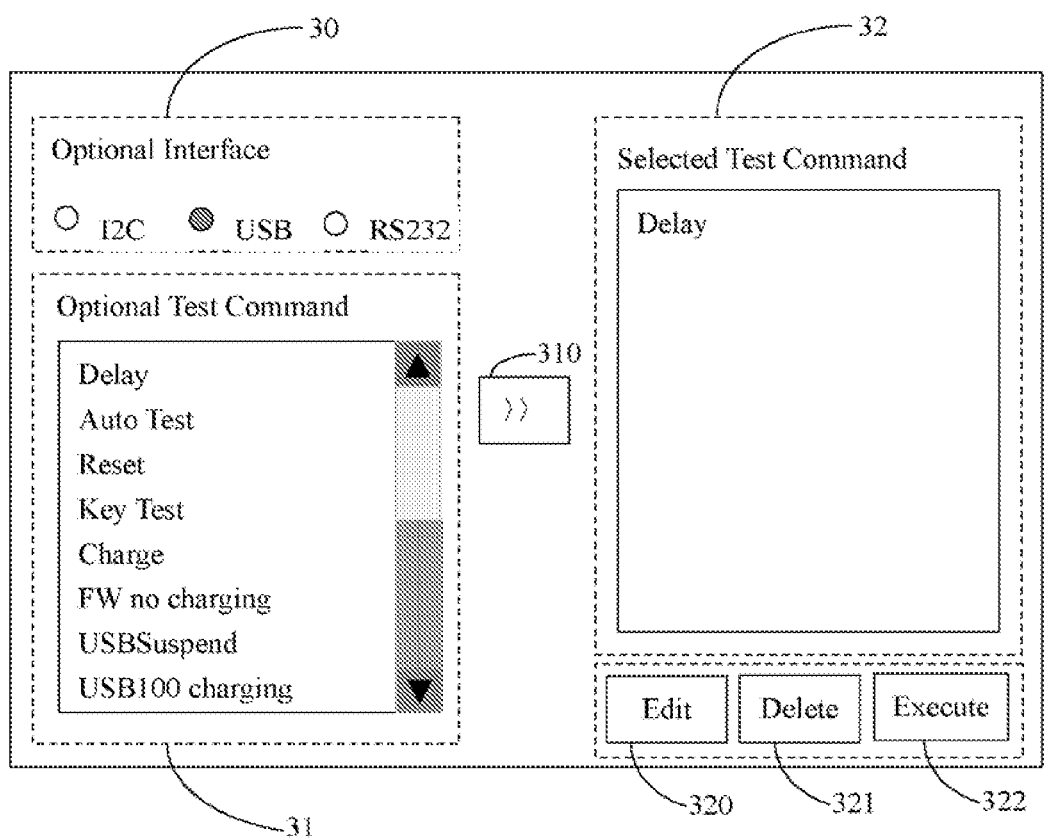
FIG. 2 is a schematic diagram showing a user interface of the test apparatus of FIG. 1.

The interface module 12 is configured for displaying the interfaces and optional test commands selectable through a user interface, and obtaining a selected interface and selected test commands corresponding to the selected interface in response to a test operator's selection. For example, in the embodiment as shown in FIG. 2, the user interface provides an optional interface region 30, an optional test command region 31, and a selected test command region 32.

The optional interface region 30 is configured for displaying optional interfaces (e.g., I2C interface, USB interface, RS232 interface, etc.). The optional test command region 31 is configured for displaying optional test commands corresponding to the selected interface in the optional interface region 30. For example, in this embodiment as shown in FIG. 2, when the USB interface is selected in the optional interface region 30, that means the to-be-tested electronic device is the mouse 2c, the optional test command region 31 thereupon displays the test commands relating to the USB interface, namely test commands for testing the mouse 2c. The selected test command region 32 is configured for displaying test commands selected from the optional test commands displayed in the optional test command region 31.

The user interface further provides a plurality of buttons for handling the optional test commands and/or selected test commands. For example, a button 310 is configured for selecting test commands from the optional test command region 31, and buttons 320, 321, and 322 are configured for editing, deleting, and executing the test commands selected respectively. That is, the buttons 320 is operable to edit instruction sets of the test command selected, the button 321 is operable to delete unnecessary test commands from the selected test command region 32, and the button 322 is operable to transmit information of the selected interface and the selected test commands displayed in the selected test command region 32 to the processing unit 13 for processing the test commands.

The processing unit 13 is programmed for parsing information of the selected interface and the selected test commands from the interface module 12 (i.e., the user interface) to obtain the interface number corresponding to the selected interface and the instruction sets corresponding to the selected test commands according to the interface number list and the test command list. In turn, the processing unit 13 transmits the instruction sets obtained to the corresponding interface according to the interface number obtained, thereby driving the to-be-tested electronic device (e.g., the mouse 2c) connected thereto to perform required tests according to the instruction sets.

Figure 3:
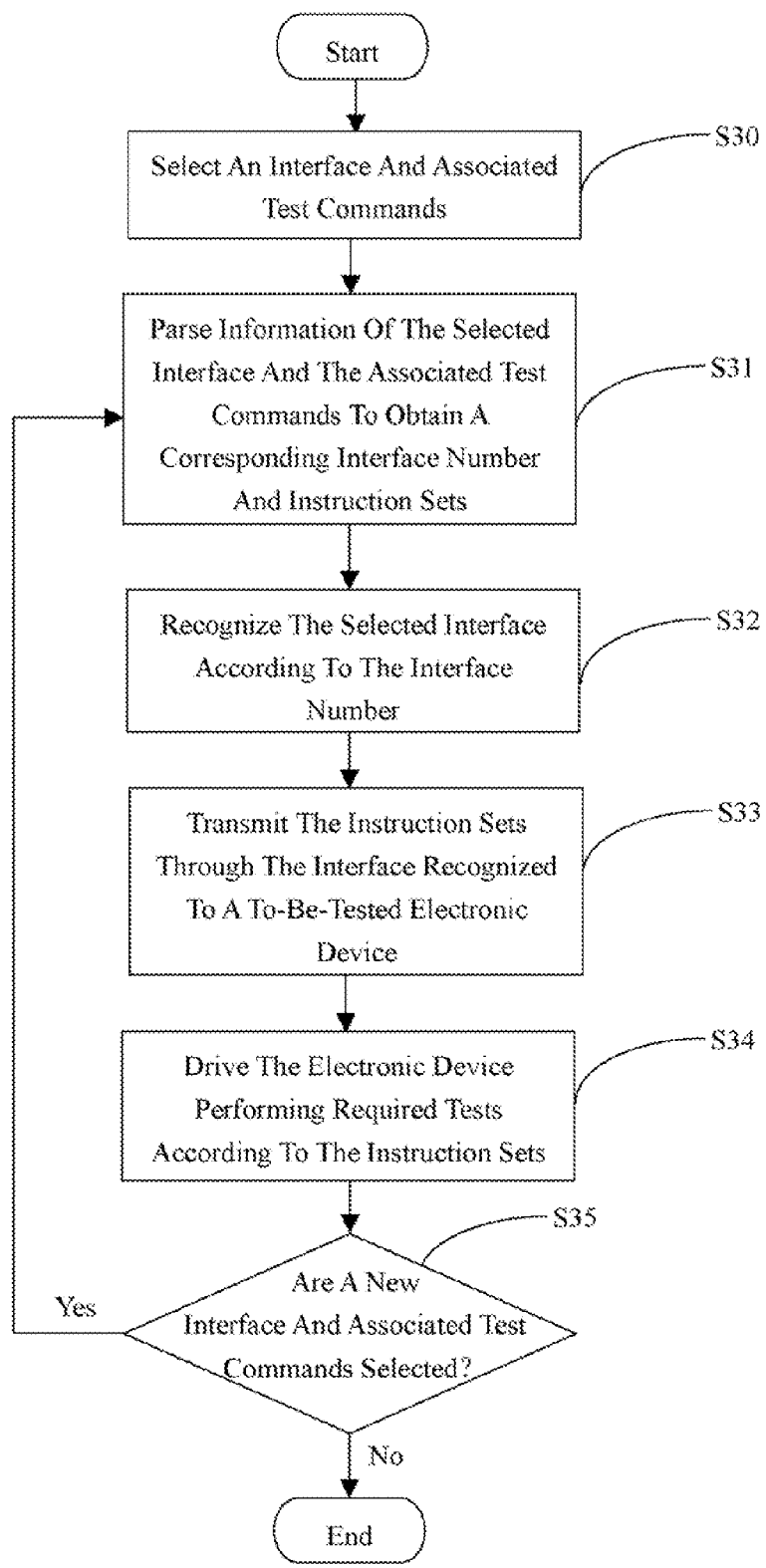
FIG. 3 is a flowchart of a preferred test method by utilizing the test apparatus of FIG. 1.

FIG. 3 is a flowchart of a preferred test method by utilizing the test apparatus of FIG. 1. In step S30, the test operator selects the interface and test commands through the user interface as shown in FIG. 2.

In step S31, the processing unit 13 parses information of the selected interface and the selected test commands from the interface module 12 (i.e., the user interface) to obtain the interface number and the instruction sets corresponding to the selected interface and the selected test commands respectively according to the interface number list and the test command list stored in the storage unit 11.

In step S32, the processing unit 13 recognizes the selected interface according to the interface number.

In step S33, the processing unit 13 transmits the instruction sets through the interface recognized to the to-be-tested electronic device connected thereto.

In step S34, the processing unit 13 drives the to-be-tested electronic device performing required tests according to the instruction sets transmitted.

In step S35, the processing unit 13 determines whether it receives a new interface and associated test commands from the interface module 12, that is, whether a new interface and associated test commands are selected by the test operator. If so, the procedure goes to step S31 described above. If no, the procedure is finished.

Although the present invention has been specifically described on the basis of a preferred embodiment and preferred method thereof, the invention is not to be construed as being limited thereto. Various changes or modifications may be made to the embodiment and method without departing from the scope and spirit of the invention.

What is claimed is:

1. A test apparatus adapted for testing different electronic devices, the apparatus comprising:

a plurality of interfaces configured for communicating with the electronic devices, wherein each interface employs a different protocol and is assigned with an interface number for identification;

a storage unit for storing an interface number list and a test command list, wherein the interface number list records the interfaces and the associated interface numbers, and the test command list records test commands relating to the interfaces and instruction sets each corresponding to a test command;

an interface module configured for displaying the interfaces and the test commands allowable to be selective through a user interface, and obtaining a selected interface and associated test commands in response to a selection; and a processing unit configured for parsing information of the selected interface and associated test commands from the interface module to obtain the interface number corresponding to the selected interface and the instruction sets corresponding to the selected test commands according to the interface number list and the test command list, and transmitting the instruction sets obtained to the corresponding interface according to the interface number obtained, thereby driving the electronic device connected thereto performing required tests according to the instruction sets.

2. The apparatus according to claim 1, wherein the interface is selected from the group consisting of an RS232 interface, an I2C interface, and a USB interface.

3. The apparatus according to claim 1, wherein the user interface provides an optional interface region and an optional test command region, the optional interface region configured for displaying the interfaces allowable to be selective, and the optional test command region configured for displaying the test commands relating to an interface selected in the optional interface region.

4. The apparatus according to claim 3, wherein the user interface further provides a selected test command region configured for displaying the test commands selected from the optional test command region.

5. A test method used in a test apparatus for testing different electronic devices, wherein the test apparatus includes a plurality of interfaces configured for communicating with the electronic devices, the method comprising the steps of:

displaying a user interface providing an optional interface region and an optional test command region, wherein the optional interface region is configured for displaying optional interfaces allowable to be selective, and the optional test command region is configured for displaying optional test commands relating to an interface selected in the optional interface region, the test commands allowable to be selective and each corresponding to an instruction set;

obtaining information of the interface and the test commands selected from the user interface;

parsing the information of the interface and the test commands selected to obtain the instruction sets corresponding to the test commands selected; and transmitting the instruction sets obtained to the corresponding electronic device through the interface selected to drive the electronic device performing required tests.

6. The method according to claim 5, wherein the user interface further provides a selected test command region configured for displaying the test commands selected from the optional test command region.

7. The method according to claim 6, wherein the interfaces is selected from the group consisting of an RS232 interface, an I2C interface, and a USB interface.

* * * * *